United States Patent
Pacco et al.

(10) Patent No.: US 12,087,994 B2
(45) Date of Patent: Sep. 10, 2024

(54) RESONATORS

(71) Applicants: IMEC vzw, Leuven (BE); Katholieke Universiteit Leuven, Leuven (BE)

(72) Inventors: Antoine Pacco, Mechelen (BE); Massimo Mongillo, Kessel-Lo (BE); Anton Potocnik, Leuven (BE); Danny Wan, Leuven (BE); Jeroen Verjauw, Leuven (BE)

(73) Assignees: IMEC vzw, Leuven (BE); Katholieke Universiteit Leuven, Leuven (BE)

( * ) Notice: Subject to any disclaimer, the term of this patent is extended or adjusted under 35 U.S.C. 154(b) by 374 days.

(21) Appl. No.: 17/450,592

(22) Filed: Oct. 12, 2021

(65) Prior Publication Data
US 2022/0115759 A1    Apr. 14, 2022

(30) Foreign Application Priority Data
Oct. 13, 2020   (EP) .................................... 20201465

(51) Int. Cl.
*H01P 7/00*      (2006.01)
*H01P 11/00*     (2006.01)

(52) U.S. Cl.
CPC .............. *H01P 7/00* (2013.01); *H01P 11/008* (2013.01)

(58) Field of Classification Search
CPC ......... H01P 7/00; H01P 11/008; H10N 60/01; H10N 60/0156
See application file for complete search history.

(56) References Cited

U.S. PATENT DOCUMENTS

| 9,177,814 B2 | 11/2015 | Chang et al. |
| 2017/0370791 A1* | 12/2017 | Nakamura .............. G01L 1/165 |
| 2020/0006619 A1 | 1/2020 | Fuhrer et al. |

FOREIGN PATENT DOCUMENTS

WO    WO 2019/032114 A1    2/2019

OTHER PUBLICATIONS

Barends et al., "Reduced frequency noise in superconducting resonators", Applied Physics Letters, vol. 97, pp. 033507-1-033507-3, 2010.
Bruno et al., "Reducing intrinsic loss in superconducting resonators by surface treatment and deep etching of silicon substrates", Applied Physics Letters, vol. 106, pp. 182601-1-182601-4, 2015.
Calusine et al., "Analysis and mitigation of interface losses in trenched superconducting coplanar waveguide resonators", Applied Physics Letters, vol. 112, pp. 062601-1-062601-5, 2018.

(Continued)

*Primary Examiner* — Andrea Lindgren Baltzell
*Assistant Examiner* — Kimberly E Glenn
(74) *Attorney, Agent, or Firm* — Knobbe Martens Olson & Bear LLP

(57) ABSTRACT

A method for forming a modified resonator is provided. In one aspect, the method includes obtaining a resonator on top of a substrate, thereby forming an interface area between a bottom surface of the resonator and a top surface of the substrate. The resonator can include niobium or tantalum. The method also includes contacting the resonator and the substrate with a liquid acidic etching solution selected so as to have a higher etch rate towards the substrate than towards the resonator and a nonzero etch rate towards the resonator.

27 Claims, 3 Drawing Sheets

(56) References Cited

OTHER PUBLICATIONS

Melville et al., Comparison of dielectric loss in titanium nitride and aluminum superconducting resonators, Applied Physics Letters, vol. 117, pp. 124004-1-124004-5, 2020.

Nersisyan et al., "Manufacturing low dissipation superconducting quantum processors", arXiv:1901.08042v1 [quant-ph], dated Jan. 23, 2019 in 9 pages.

Wisbey et al., "Effect of metal/substrate interfaces on radio-frequency loss in superconducting coplanar waveguides", Journal of Applied Physics, vol. 108, 093918-1-093918-4, 2010.

Woods et al., "Determining interface dielectric losses in superconducting coplanar waveguide resonators", Physical Review Applied, vol. 12, Issue 1, Jul. 2019 in 11 pages.

Yang et al., Manufacture and Characterization of High Q-Factor Inductors Based on CMOS-MEMS Techniques, Sensors, vol. 11, pp. 9798-9806, 2011.

Extended European Search Report dated Mar. 18, 2021 in European Application No. 20201465.0 in 7 pages.

\* cited by examiner

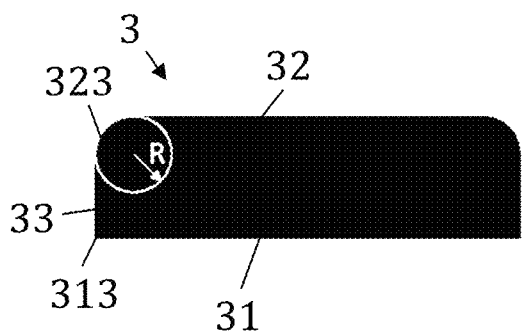
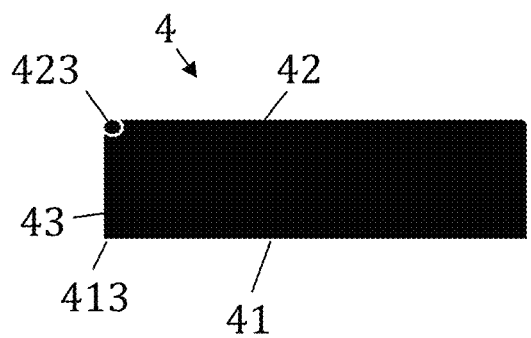
FIG. 1A
FIG. 1B
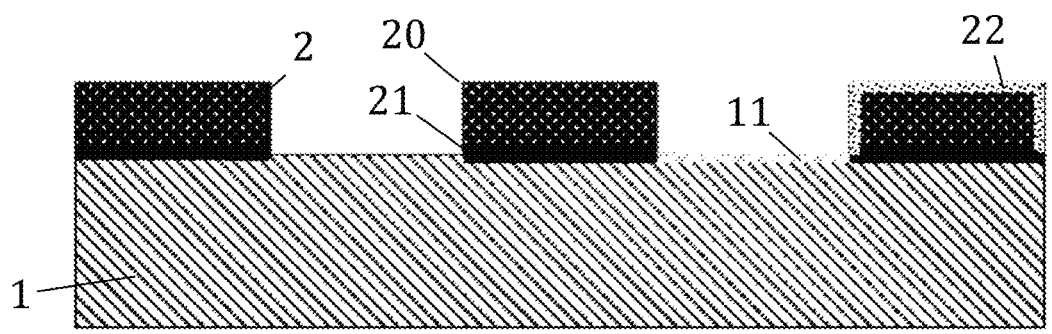
FIG. 2A
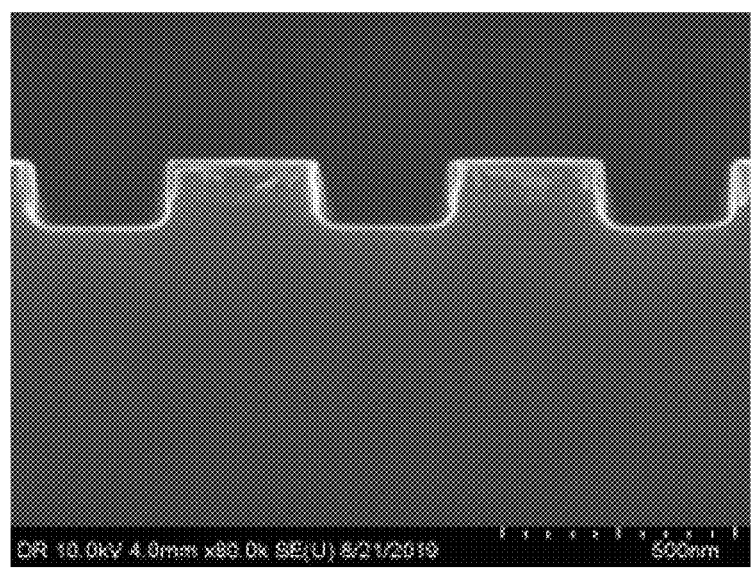
FIG. 2B

RESONATORS

CROSS-REFERENCE TO RELATED APPLICATION

This application claims foreign priority to European Patent Application No. EP 20201465.0, filed Oct. 13, 2020, the content of which is incorporated by reference herein in its entirety.

BACKGROUND

Technical Field

The disclosed technology generally relates to the field of resonators and their formation. In particular, the disclosed technology relates to the field of resonators for the realization of a quantum bit.

Description of the Related Technology

Resonators, in particular superconducting resonators, are one of the fundamental components for the realization of quantum-bits, e.g., "qubits", for quantum computing. In general, a resonator of a quantum circuit can be a microwave transmission line that is deliberately designed to support resonant oscillations (e.g., resonance) within the line, under certain conditions (e.g., a resonant microwave transmission line). Resonators of superconducting qubit devices can be implemented as coplanar waveguides (CPWs), which is a particular type of a microwave transmission line. Quantum computing can require low-loss operations of the resonators in various instances. In some instances, it can be desirable that the resonator of a quantum computer has a quality factor of at least 1,000,000, e.g., in each radian of a cycle of oscillation, the resonator may lose less than 1/1,000,000 of peak energy stored in the resonator. As extremely low microwave powers are stored in the resonator, for example in the order of attowatts or $10^{-18}$ watts, such a low loss may be in some instances be necessary to reach a long qubit lifetime (e.g., long coherence time even at temperatures of ~20 mK). High-quality factor (e.g., low-loss) resonators are of fundamental importance for reaching long coherence times in superconducting qubits, for storage of arbitrary quantum states in superconducting resonators at very low fields (e.g., in the single-photon regime) where the electric field can be much less than the critical field, and for low-loss coupling between two qubits mediated by a low-loss resonator.

Furthermore, low-loss resonators can also be in some instances required for quantum-limited microwave amplifiers, which can be extremely sensitive amplifiers used, for example, for gravitational waves detection, and for multi-plexed readout of microwave kinetic inductance photon detectors (MKID), for example in astronomy.

SUMMARY OF CERTAIN INVENTIVE ASPECTS

A resonator can include a superconductor material and be on an insulating substrate. Superconductor materials for resonators can include aluminum (Al), titanium nitride (TiN), niobium (Nb), niobium nitride (NbN), and niobium titanium nitride (NbTiN), and for the insulating substrate, can include crystalline sapphire or high-resistivity silicon substrates.

At low microwave field levels and low temperatures (e.g., 20 mK) used in particular in superconducting quantum information applications, the quality factors of the resonator can be reduced by parasitic two-level systems (TLS) losses. TLS losses can be due to defects in a material, e.g., the substrate or a native oxide layer, in the proximity of the resonator. The defect may in particular be represented by an atom that tunnels between two nondegenerate minima of a potential provided by the environment of the atom, thereby forming the TLS. The TLS may interact with and absorb a photon in the resonator, consequently resulting in loss of energy. Predominantly amorphous materials, oxides, and dielectrics at surfaces and/or interfaces of the resonator contribute to TLS losses, and also oxides on the surface of the substrate may contribute to the TLS losses.

To reduce TLS losses, the material in the proximity of the resonator contributing to the TLS losses may be removed. For instance, in the article by Woods et al., Determining Interface Dielectric Losses in Superconducting Coplanar-Waveguide Resonators, *Physical Review Applied* Volume 12, Issue 1 (July 2019), an interface area between a bottom surface of the resonator on the substrate and a top surface of the substrate can be effectively reduced by forming a photoresist on the resonator and etching the substrate selectively with respect to the photoresist. The etching technique used is an isotropic etching technique. The substrate underlying the resonator is etched, for example, underetching of the resonator occurs, thereby reducing the interface area. Finally, the photoresist is removed using a combination of ashing solvent resist strips. The use of photoresists, which can be used to underetch resonators, can, however, be unwanted, because the process of removing the photoresist may induce defects on surfaces of the resonator. These defects may give rise to further resonator losses.

In addition, the edges of the resonators can be sharp, which the present inventors believe may be a source of further losses. Without being bound to any particular theory, in various instances, a wave propagating on the surface of the resonator cannot follow the sharp angles at the cavity edges, hence resulting in radiative loss of the energy in the resonator.

Furthermore, control of the substrate and resonator profiles formed by the etching, e.g., control of the etching, can be particularly advantageous. For example, when many resonators on a single substrate are etched at the same time, the control of etching can be advantageous to, at the same time, minimize the interface area and prevent the collapse of at least part of the resonators. Moreover, it is desirable that resonators have the same, predictable, properties such as well-resolved resonator frequency and high-quality factor. Etching is therefore preferably highly reproducible. Finally, resonators generally can also include a native oxide layer on their surfaces which may give rise to further TLS losses.

Therefore, there is a need to address one or more of the above problems.

An objective of the disclosed technology is to provide methods of reducing energy losses in a resonator. It is a further objective of the disclosed technology to provide a resonator obtainable by the methods.

These and other objectives may be accomplished by various implementations of a method and device according to the disclosed technology.

It is an advantage of embodiments of the method of the disclosed technology that the interface area between the resonator and the substrate can be reduced. The substrate inherently can include defects, which can lead to two-level system (TLS) losses in the resonator. It is an advantage of embodiments of the disclosed technology that resonators can be provided with low TLS losses. The resonators modified by embodiments of the disclosed technology tend to have smoother surfaces after modification. This can favor low TLS losses. It is a further advantage of embodiments of the disclosed technology that rounded edges can be achieved, which can result in a further reduction of losses in the resonator. Therefore, resonators according to embodiments of the disclosed technology can have particularly low losses and therefore a long coherence time and a high-quality factor.

It is an advantage of embodiments of the disclosed technology that no photoresist needs to be used in the method. It is an advantage of embodiments of the disclosed technology that by selecting the etching solution so that it has a higher etching rate towards the substrate than towards the resonator, a considerable reduction of the interface area can be achieved without the need for a photoresist. The acidic nature of the etching solution can help assure that the etching of the substrate can be isotropic and that its rate toward a niobium or tantalum-comprising resonator is non-zero. It is an advantage of embodiments of the disclosed technology that the method is particularly well suited for resonators including niobium or tantalum. In particular, niobium can be widely used in resonators.

It is an advantage of embodiments of the disclosed technology that native oxides eventually present on the surface of the resonator may be removed. The oxides on the surface may induce TLS losses. It is an advantage of embodiments of the disclosed technology that TLS losses due to native oxides on the resonator surface are reduced. It is an advantage of embodiments of the disclosed technology that a wet etch can be used, resulting in reduced or limited substrate surface roughness and reduced or limited damage to the substrate crystal structure when compared to dry etch techniques.

It is an advantage of embodiments of the disclosed technology that the method is reproducible, reproducibly yielding resonators with approximately the same resonator frequency and quality factor.

According to a first non-limiting aspect, the disclosed technology relates to a method of forming a modified resonator, the method including:
  a. obtaining a resonator on top of a substrate, the resonator including niobium or tantalum, thereby forming an interface area between a bottom surface of the resonator and a top surface of the substrate, and
  b. contacting the resonator and the substrate with a liquid acidic etching solution selected to have a higher etch rate towards the substrate than towards the resonator and a nonzero etch rate towards the resonator.

According to a second non-limiting aspect, the disclosed technology relates to a resonator on a substrate. The resonator can include niobium or tantalum and at least one rounded edge having a radius of curvature from 15 nm to 40 nm. A bottom surface of the resonator can have an area larger than an interface area between the bottom of the resonator and a top surface of the substrate.

Non-limiting implementations are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the various implementations of the disclosed technology represent substantial new and novel improvements, including departures from prior practices, resulting in the provision of more efficient, stable and reliable devices of this nature.

The above and other characteristics, features and advantages of the disclosed technology will become apparent from the following detailed description, taken in conjunction with the accompanying drawings, which illustrate, by way of example, the principles of the disclosed technology. This description is given for the sake of example only, without limiting the scope of the disclosed technology. The reference figures quoted below refer to the attached drawings.

BRIEF DESCRIPTION OF THE DRAWINGS

FIG. 1A and FIG. 1B are schematic vertical cross-sections of example resonators with a different radius of curvature of some of the edges.

FIG. 2A is a schematic vertical cross-section and FIG. 2B is a SEM image of an example resonator on top of a substrate according to embodiments of the disclosed technology.

Figure 3A:
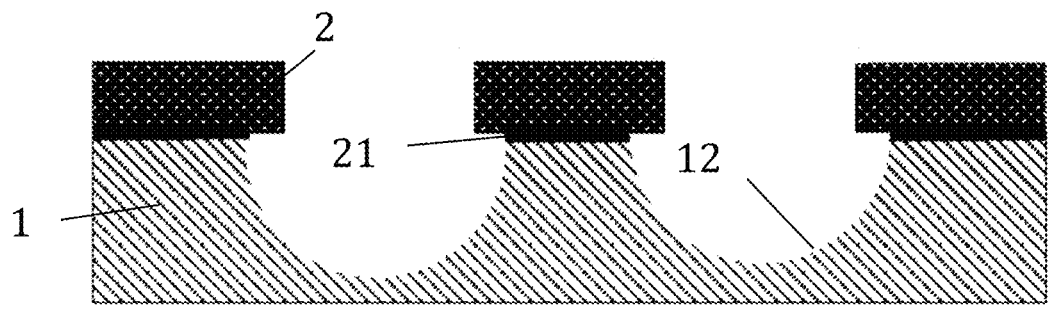
FIG. 3A is a schematic vertical cross-section and FIG. 3B is a SEM image of an example resonator on top of a substrate after application of a dry isotropic etch.

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings but the disclosed technology is not limited thereto. The drawings described are only schematic and are non-limiting. In the drawings, the size of some of the elements may be exaggerated and not drawn to scale for illustrative purposes. The dimensions and the relative dimensions may not correspond to actual reductions to practice.

Furthermore, the terms first, second, third, and the like in the description are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

The term "comprising", used in the claims, should not be interpreted as being restricted to the features listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosed technology therefore also includes as one embodiment that no further components are present. Thus, the scope of the expression "a device comprising A and B" should not be interpreted as being limited to devices consisting only of components A and B.

Reference throughout this specification to "one embodiment" or "an embodiment" indicates that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosed technology, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the disclosed technology requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

In the description provided herein, numerous specific details are set forth. However, it is understood that embodiments of the disclosed technology may be practiced without these specific details. In other instances, well-known methods, structures, and techniques have not been shown in detail in order not to obscure an understanding of this description.

According a first non-limiting aspect, the disclosed technology relates to a method of forming a modified resonator, the method including:
  a. obtaining a resonator on top of a substrate, the resonator including niobium or tantalum, thereby forming an interface area between a bottom surface of the resonator and a top surface of the substrate, and
  b. contacting the resonator and the substrate with a liquid acidic etching solution selected to have a higher etch rate towards the substrate than towards the resonator and a nonzero etch rate towards the resonator.

A resonator may take the shape of a coplanar waveguide resonator. It may include a signal line separated from a ground plane by two gaps which can be identical. In various implementations, the signal line and the ground plane all lie in the same plane over a substrate and are all made from electrically conductive materials (e.g., from superconductors). When the term "resonator" is used, it may therefore relate to the signal line and a ground plane.

In step a, the resonator may be obtained on the substrate by depositing a metal layer and forming the resonator from that layer. For instance, the resonator may be obtained by performing a lithography step involving the formation of a mask over the layer and a dry plasma etching step through the mask.

Unless provided otherwise, when a resonator is referred to in the rest of the description and it is not mentioned whether it is the resonator obtained in step a or after step b, it means that both, the resonator obtained in step a and after step b are referred to. Indeed, many characteristics (e.g., chemical nature, dimensions, overall shape when the rounding of the edges are neglected, etc.) can remain substantially unchanged between steps a and b in various instances.

In some embodiments, the resonator includes one of the following materials: niobium, tantalum, NbN, and NbTiN. In some embodiments, the resonator includes or consists of niobium. The dimensions of the resonator can be such that a standing wave can exist and be contained within the resonator, where the standing wave has a frequency from 1 GHz to 10 THz, such as from 4 GHz to 8 GHz. In some embodiments, the signal line of the resonator may have a width from 125 nm to 30 μm, from 500 nm to 20 μm, or from 5 to 15 μm. In some embodiments, the resonator (e.g., the signal line and the ground plane) may have a height from 35 to 140 nm. In some embodiments, the resonator (e.g., the signal line and the ground plane) may have a length from 0.1 to 1 cm, or from 2 to 5 mm. In some embodiments, the resonator (e.g., the signal line and the ground planes) may have a rectangular cuboid shape. In some embodiments, the shape of the signal line may be irregular. In some embodiments, the resonator includes a rectangular cuboid form.

In some embodiments, the substrate may include silicon, silicon germanium, or gallium arsenide, preferably silicon in some instances. These materials are widely used in semiconductor manufacturing. Also, these materials can be etched faster by acid solutions than niobium or tantalum. In some embodiments, the substrate consists of a silicon, silicon germanium, or gallium arsenide bulk and optionally an oxide top surface. In various implementations, the substrate is crystalline. Crystallinity of the substrate can reduce TLS losses because of the relatively low concentration of defects compared to amorphous materials.

The resonator obtained in step a can include at least one edge. Although the method according to the first non-limiting aspect can be useful even for resonators that do not have edges due to its surface smoothing effect, the method of the first non-limiting aspect can be particularly useful for modifying resonators having at least one edge due to its edge rounding effect.

When at least one edge is present in the resonator, it can be formed by the intersection of two adjacent surfaces of an element of the resonator (e.g., two adjacent surfaces of its signal line). Examples of surfaces that can intersect to form the at least one edge are the bottom surface and a lateral surface of the signal line or the top surface and a lateral surface of the signal line. In various implementations, the surfaces forming the at least one edge are planar.

Although the surfaces forming the at least one edge can theoretically meet in a single line defining the edge, in practice, the at least one edge of the resonator obtained in step a may already present some rounding. In other words, the at least one edge obtained in step a may be a curved surface joining both planar surfaces forming the at least one edge.

In embodiments where the at least one edge is a curved surface, this surface may have a degree of curvature that equals the angle between the adjacent surface planes connected by the curved surface.

In embodiments wherein the resonator obtained in step a is composed of rectangular cuboid resonator elements, e.g., a resonator which signal line and ground planes each substantially have the form of a rectangular cuboid, and wherein the edges are curved surfaces, these surfaces have a degree of curvature of 90°.

For instance, a rectangular cuboid resonator element including a top surface, a bottom surface, and four lateral surfaces, may have eight edges, each being either defined by the intersection between two surfaces or by a curved surface connecting two surfaces. For instance, it may have a first edge defined either by a line at the intersection between the top surface of the resonator and one of the lateral surfaces, or by a curved surface that connects the top surface of the resonator and one of the lateral surfaces.

The edges of the resonator before step b (e.g., as obtained in step a, a' or a", see below) of the method may in some embodiments be sharp. Sharp edges may result in radiative loss of a wave resonating in the resonator.

Therefore, in various implementations, the edges of the resonator are rounded during step b.

As used herein, a sharp edge can be either a line at the intersection between two adjacent (e.g., planar) surfaces or a curved surface joining two adjacent planar surfaces, the curved surface having a radius of curvature below 10 nm.

The radius of curvature is a radius of a circle that best fits the curved surface of the edge. In some embodiments, the method of the first non-limiting aspect may introduce a curvature in the at least one edge (when the at least one edge was defined by a line at the intersection of two surfaces) or may increase the radius of curvature of the at least one edge (when the at least one edge was defined by a curved surface at the intersection of two surfaces). In some embodiments, the method of the first non-limiting aspect may reduce the sharpness of the at least one edge and may result in a rounded edge, e.g., an edge where a curvature has been introduced or increased. In some embodiments, rounding at least one edge of the resonator includes rounding at least two edges of the resonator, such as all edges of the signal line or even all edges comprised in the resonator in some instances. In some embodiments, rounding at least one edge of the resonator includes increasing the average radius of curvature of the edges of the resonator. The average radius of the curvature of the edges of the resonator can refer to the radius of curvature averaged over the edges of the resonator. In other words, the average radius of curvature of the edges of the resonator can be defined by the sum of the radius of curvature of each edge of the resonator, divided by the number of edges. In some embodiments, the average radius of curvature of the edges after step b is larger than the average radius of curvature of the edges before step b. In some embodiments, rounding at least one edge of the resonator includes rounding at least one edge of the signal line by increasing the average radius of curvature of the edges of the signal lines. The average radius of the curvature of the edges of the signal line can refer to the radius of curvature averaged over the edges of the signal line. In other words, the average radius of curvature of the edges of the signal line can be defined by the sum of the radius of curvature of each edge of the signal line, divided by the number of edges. In some embodiments, the average radius of curvature of the edges of the signal line after step b is larger than the average radius of curvature of the edges of the signal line before step b. In some embodiments, the radius of curvature of the at least one edge after step b is from 1.2 to 10, such as from 1.5 to 5 or from 1.5 times to 3 times the radius of curvature of the at least one edge before step b. In some embodiments, the average radius of curvature of the edges of the resonator after step b is from 1.2 to 10, such as from 1.5 to 5 or from 1.5 times to 3 times the average radius of curvature of the edges before step b.

In some embodiments, the average radius of curvature of the edges of the signal line after step b is from 1.2 to 10, such as from 1.5 to 5 or from 1.5 times to 3 times the average radius of curvature of the edges of the signal line before step b. In some embodiments, the radius of curvature of the at least one edge before step b may be below 10 nm, and after step b be from 15 nm to 40 nm. For instance, in some embodiments, the average radius of curvature of the edges of the resonator before step b may be below 10 nm, and after step b be from 15 nm to 40 nm.

For instance, in some embodiments, the average radius of curvature of the edges of the signal line before step b may be below 10 nm, and after step b be from 15 nm to 40 nm.

In some embodiments, rounding at least one edge (e.g., all edges of the signal line or all edges of the resonator) of the resonator yields a low-loss resonator, e.g., a resonator having a quality factor of at least 1,000,000.

The resonator and the substrate are in direct contact with each other, e.g., the resonator is on top of the substrate, thereby forming an interface between the bottom surface of the resonator and the top surface of the substrate. In some embodiments, the complete bottom surface of the resonator obtained in step a is in direct contact with the substrate. The interface area can refer to the area of the interface between the bottom surface of the resonator and the top surface of the substrate. In some embodiments, the magnitude of the interface area is within 5% of, within 1% of, or equal to the product of the lateral dimensions of the resonator, e.g., the surface area of the bottom surface of the resonator. The interface may include a native oxide layer belonging to the substrate. The native oxide of the interface may induce TLS losses. Although the top surface of the substrate may be cleaned, e.g., by using a HF etching solution, before deposition of the resonator on the substrate, thereby substantially removing the native oxide from the top of the substrate, a small amount of the native oxide may still be left after the cleaning. In some embodiments, after the formation of the resonator on top of the substrate, the native oxide may still be present at the interface. Because of the extremely low loss desired for resonators, e.g., for quantum computing, even TLS losses due to the small amount of the native oxide at the interface may be problematic. Therefore, the interface area can be reduced as much as it is mechanically possible during step b. If the interface area becomes too small, however, the resonator may collapse on the substrate in some cases. Therefore, a balance can be sought between limiting TLS losses of the resonator and preventing the collapse of the resonator on top of the substrate. In some embodiments, step b reduces the interface area by 5% to 95%, such as by 50% to 95% in some instances, with respect to the interface area formed in step a. Reducing the interface area can include removing part of the substrate underneath the resonator.

In embodiments of the disclosed technology, the liquid acidic etching solution is selected so that it has a higher etch rate towards the substrate than towards the resonator. Therefore, advantageously, no photoresist to prevent the liquid acidic etching solution from substantially etching the resonator is required in implementations of this method. Although the etch rate towards the substrate is higher than towards the resonator, the etch rate towards the resonator is nonzero. The nonzero etch rate towards the resonator can enable the rounding of the edges. An additional advantage of the nonzero etch rate towards the resonator is that it may improve the surface smoothness of the resonator. In some embodiments, the liquid acidic etching solution includes hydrofluoric acid (HF) and nitric acid ($HNO_3$). In some embodiments, the liquid acidic etching solution may further include a diluent such as water ($H_2O$) or acetic acid ($CH_3COOH$), preferably $H_2O$ in some instances. In some of these embodiments, the liquid acidic etching solution includes from 30 to 70, such as from 60 to 70 or from 65 to 69, parts by volume of $HNO_3$, and from 0.1 to 5, such as from 0.1 to 2 or 0.4 to 0.6, parts by volume of HF, and additional parts by volume of the diluent so that the parts by volume of $HNO_3$, HF, and the diluent add up to 100. In some embodiments, the temperature of the etching solution is constant, which may result in a constant, hence controllable, etch rate. In some embodiments, the temperature is from 20° C. to 70° C. These embodiments can have the effect that, due to the presence of $HNO_3$, the resonator is constantly oxidized so that the surfaces of the resonator remain oxidized after step b. There can therefore be an oxide layer present at the surfaces of the resonator after step b in some instances. The solution including HF and $HNO_3$ has a nonzero etch rate towards the resonator but can have a considerably higher etch rate towards the substrate than towards the resonator. This is true for most substrates and in particular for silicon, silicon germanium, or gallium arsenide. In some embodiments, a ratio of the etch rate towards the substrate to the etch rate towards the resonator is at least 5, such as from 5 to 500, or from 10 to 100 in some instances.

The ratio may be improved or optimized by improving or optimizing the mix ratio of the acids included in the liquid acidic etching solution and/or by adding additives. For instance, in some embodiments, by increasing the concentration of HF, the etch rate towards both the resonator and the substrate may increase, but the etch rate towards the resonator may increase more than the etch rate towards the substrate, so that the ratio becomes lower. In some embodiments, conversely, by reducing the concentration of HF, the ratio may increase. The liquid acidic etching solution can isotropically etch the substrate, e.g., the liquid acidic etching solution can etch at the same etch rate in all directions, e.g., the etch rate can be independent of the etching direction. In some embodiments, the etching caused by the liquid acidic etching solution results in a cavity in the substrate having an isotropic profile after application of the solution. For instance, the cavity may have the shape of a truncated sphere.

In some embodiments, step b may oxidize the surface of the resonator so that oxides are present on the surface of the resonator. Oxides on the surface of the resonator may induce TLS losses. Therefore, in some embodiments, the method includes a step c after step b of removing any oxides on the surface of the resonator. In some embodiments, in step c, also any oxides on an exposed top surface of the substrate, e.g., at an interface of the substrate and air, may be removed. Oxides on the exposed top surface of the substrate may also induce TLS losses. In some embodiments, step c may include applying a liquid etching solution including HF and no $HNO_3$. HF can be applied to remove native oxides on a surface.

In some embodiments, the method includes a step a' after step a and before step b of etching the substrate, selectively with respect to the resonator, by applying a liquid alkaline etching solution, thereby anisotropically etching the substrate and reducing the interface area. This embodiment can be particularly useful when the substrate includes a crystalline structure to be etched. The use of a liquid alkaline etching solution can have the advantage that it can etch the substrate anisotropically along well-defined crystallographic substrate planes. This can allow a good level of control of the portion of the interface removed by the etching process. In some instances, the intrinsic directionality of the liquid alkaline etch can allow for the etching of the substrate to be self-aligned to crystallographic substrate planes of the substrate.

Although the liquid acidic etching solution from step b etches, within a material, at a similar etch rate in all directions (e.g., the etch rate can be independent of the direction), the liquid alkaline etching solution has an etch rate that is anisotropic, e.g., which depends on the etch direction within the substrate, for example due to different etch rates towards different crystal planes. For instance, in silicon, the etch rate of the liquid alkaline etching solution towards Si(111) planes is particularly low. In some embodiments, the temperature of the liquid alkaline etching solution may be set above room temperature. Advantageously, in this way, the etch rate also towards the Si(111) planes may be increased, thereby reducing the required etching time. An increase in the etch rate toward the Si(111) planes can also be observed when the liquid alkaline etching solution is stirred, e.g., using a mechanical stirrer, during step a'.

In some embodiments, the resonator may include at least one bent surface.

Since the etch rate of the liquid alkaline etching solution depends on the etch direction within the material, in some embodiments where the resonator includes a bent surface, the speed at which the liquid alkaline etching solution etches the substrate at the interface with the resonator may differ locally. For example, reducing a first part of the interface area may in some embodiments of step a' occur at a different rate than reducing a second part of the interface area. This difference in etch rate may in some embodiments be advantageously used as a parameter to improve or optimize the etching of the interface. Alternatively, in some implementations, the etching rate may be homogenized for the interface area by adapting the resonator design or the substrate orientation (e.g., by using a Si(110) substrate).

In some embodiments, the profile of the cavity in the substrate after application of the liquid alkaline etching solution of step a' may be anisotropic. For instance, a surface of the etched cavity may be flat along a crystal plane. In some embodiments, the liquid alkaline etching of the substrate is self-aligning. This is advantageous because the etching can be anisotropic and highly controllable. This is advantageous because it can reduce the need for a lithographic mask, as would be the case for instance in the case of anisotropic (dry) plasma etching or reactive-ion etching. In some embodiments, the liquid alkaline etching solution includes a hydroxide, such as one of the following hydroxides: tetramethylammonium hydroxide, ammonium hydroxide, and sodium hydroxide. In some embodiments, the liquid alkaline etching solution etches the substrate selectively with respect to the resonator. In some embodiments, the liquid alkaline etching solution substantially does not etch the resonator. Combining the liquid acidic etching solution and the liquid alkaline etching solution has the advantage to provide a further parameter to improve or optimize the profile of the resonator and/or the substrate. Indeed, in some embodiments, the profile of the substrate may be first etched in step a' to assume the anisotropic profile, which is then further etched isotropically in step b. The resulting profile of the substrate may in some embodiments be a combination of the anisotropic profile and the isotropic profile. Combining the liquid acidic etching solution and the liquid alkaline etching solution may in some embodiments provide a further parameter to improve or optimize the interface area, such as the magnitude of the interface area. Indeed, although the nonzero etch rate of the liquid acidic etching solution towards the resonator can be considered an advantage, in some embodiments, it may be difficult to sufficiently reduce the interface area without at the same time etching too much of the resonator, e.g., when only the liquid acidic etching solution is used. Etching too much of the resonator may result in a shift of the oscillation frequency of the resonator in some implementations. In some embodiments, step a' reduces the interface area by 5% to 95%, such as by 50% to 95% in some instances, with respect to the interface area formed in step a.

In some embodiments according to the first non-limiting aspect, instead of the step a', the method may include a step a" after step a and before step b of etching the substrate, selectively with respect to the resonator, by applying a dry isotropic etch, thereby reducing the interface area. In some embodiments, the dry isotropic etch may be an Inductively Coupled Plasma Etching (ICPE) technique, wherein the dry isotropic etch includes nitrogen trifluoride ($NF_3$) and hydrogen ($H_2$) gas. ICPE with $NF_3$ and $H_2$ gas does not etch various metals, including niobium and tantalum, e.g., it etches the substrate selectively with respect to the resonator. In some embodiments, the dry isotropic etch substantially does not etch the resonator. Combining the liquid acidic etching solution and the dry isotropic etch may, in some embodiments, provide a further parameter to improve or optimize the interface area, such as the magnitude of the interface area. Indeed, although the nonzero etch rate of the liquid acidic etching solution towards the resonator can be considered an advantage, in some embodiments, it may be difficult to sufficiently reduce the interface area without at the same time etching too much of the resonator, e.g., when only the liquid acidic etching solution is used. In some embodiments, step a" reduces the interface area by 5% to 95%, such as by 50% to 95% in some instances, with respect to the interface area formed in step a.

The modified resonator formed by embodiments of the method of the disclosed technology can have the same composition and dimensions as the resonator obtained in step a, but has rounded edges. In some embodiments, the average radius of curvature of the modified resonator is from 15 nm to 40 nm. In some embodiments, the interface between the resonator and the substrate is of the same material as the interface between the modified resonator and the substrate but the magnitude of the interface area is different. In some embodiments, the interface area may be from 5% to 95%, such as from 50% to 95%, of the area of the bottom surface of the modified resonator in some instances. In some embodiments, the resonator may include or consists of one of the following materials: niobium, tantalum, NbN, and NbTiN, preferably niobium or tantalum in some instances. In some embodiments, the resonator consists of niobium. In some embodiments, the dimensions, e.g., each of the thickness and the two lateral dimensions, of the modified resonator may be the same or may be within 1% of the dimensions of the resonator obtained in step a. In some embodiments, the surface of the modified resonator may include substantially no oxides such as native oxides. In some embodiments, the profile of the substrate underneath the modified resonator may include one of the following profiles: the isotropic profile, the anisotropic profile, and a combination of the isotropic profile and the anisotropic profile.

According to a second non-limiting aspect, the disclosed technology relates to a resonator on a substrate, the resonator including niobium or tantalum and at least one rounded edge having a radius of curvature from 15 nm to 40 nm, wherein a bottom surface of the resonator has an area larger than an interface area between the bottom of the resonator and a top surface of the substrate.

The disclosed technology also relates to a (modified) resonator obtainable by any embodiment of the first non-limiting aspect described herein.

Any feature of the resonator and the substrate of the second non-limiting aspect may be as defined for the modified resonator and the substrate in any embodiment of the first non-limiting aspect of the disclosed technology.

For example, the resonator and the substrate according to the second non-limiting aspect may have the same features as the modified resonator and the substrate according to the device formed by any embodiment of the method of the first non-limiting aspect. The features of the resonator and the substrate according to the second non-limiting aspect may have the same advantages as features of the resonator and the substrate formed by the method of the first non-limiting aspect.

Herebelow are some examples of features that the resonator of the second non-limiting aspect may have. Other examples are available in the description of the modified resonator of the first non-limiting aspect.

In some embodiments, the average radius of curvature of the rounded edges of the resonator may be from 15 nm to 40 nm. Such a large average radius of curvature may significantly reduce the radiative losses of, in particular, a wave propagating on the resonator surface.

In some embodiments, the interface area between the bottom of the resonator and a top surface of the substrate may be from 5% to 95%, such as 50% to 95% in some instances, of the area of the bottom surface of the resonator. In some embodiments, the resonator may consist of niobium, and the substrate may include or consist of silicon, silicon germanium, or gallium arsenide, preferably silicon in some instances.

The disclosed technology will now be described by a detailed description of several non-limiting embodiments. It is clear that other embodiments can be configured according to the knowledge of persons skilled in the art without departing from the technical teaching of the disclosed technology.

Examples

Reference is made to FIG. 1A and FIG. 1B that show a vertical cross-section of a first 3 and a second rectangular cuboid resonator 4. Each of the rectangular cuboid resonators has a bottom surface 31 and 41, a top surface 32 and 42 and a lateral surface 33 and 43. A first edge 313 and 413 including an edge line connects a first surface plane that includes the bottom surface 31 and 41 with a second surface plane that includes the lateral surface 33 and 43. The first and second surface plane are adjacent planes.

Furthermore, in both resonators, a second edge 323 and 423 includes an edge surface that connects a third surface plane including the top surface 32 and 42 with the second surface plane, wherein the second and third surface planes are adjacent surface planes. The angle between the second and third surface planes in both cases equals 90°. In this embodiment, the degree of curvature of the second edge equals 90°. A circle that best fits the surface of the second edge 323 and 423 is shown in each case. The radius of the circle, e.g., R in FIG. 1A, equals a radius of curvature of the second edge 323 and 423. The radius of curvature of the second edge 323 of the first resonator 3 is larger than the radius of curvature of the second edge 423 of the second resonator 4. That is, the second edge 323 of the first resonator 3 is less sharp and more rounded than the second edge 423 of the second resonator 4. For instance, applying a liquid acidic etching solution of step b of the method of the disclosed technology to second resonator 4 may in embodiments yield the first resonator 3.

Reference is made to FIG. 2A, which is a schematic vertical cross-section of a resonator 2 on top of a substrate 1 according to an embodiment of the disclosed technology: three resonators 2 are shown on top of the substrate 1. FIG. 2A shows the resonator 2 on top of the substrate 1 after step a of embodiments of the method of the first non-limiting aspect of the disclosed technology, e.g., before the application of any etch. The resonator 2 in this example has the form of a rectangular cuboid. An interface area 21 exists between the top surface of the substrate 1 and the bottom surface of the resonator 2. The interface area 21 may include oxides, for example from the substrate 1, wherein the oxides may be a first source of TLS losses for any oscillating field in the resonator 2. Furthermore, the top surface of the substrate 1 may include oxides 11, which may be a second source of TLS losses for any oscillating field in the resonator 2. Also, the surface of the resonator 2 may include oxides 22, which may be a third source of TLS losses for any oscillating field in the resonator 2. One aim of embodiments of the method of the disclosed technology is to reduce the three sources of TLS losses. Reference is now made to FIG. 2B, which shows an SEM image of the resonator 2 on top of the substrate 1 according to embodiments of the disclosed technology. As can be observed, the edges 20 of the resonator are still substantially sharp e.g., they have a small radius of curvature.

Figure 3B:
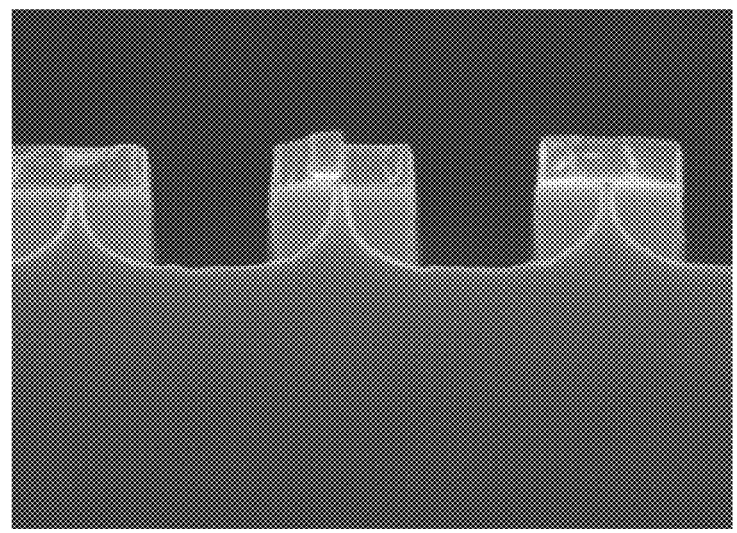

Reference is now made to FIG. 3A. A dry isotropic etch is applied to the resonator 2 and the substrate 1, wherein the dry isotropic etch selectively etches the substrate 1, selectively with respect to the resonator 2, thereby reducing the interface area 21, e.g., an embodiment of step a" of the method of the disclosed technology. Due to the high selectivity of the etch, the edges of the resonator 2 are not rounded. In this example, in the case of the middle of the three resonators 2, the interface area 21 after step a" has been reduced by approximately one-third, e.g., 33%, compared to the interface area 21 after step a. In addition, the surface of the substrate 12 has assumed an isotropic profile, e.g., forming part of a sphere. This is a result of the dry isotropic etch having equal etch rates in all directions of the substrate 1. Reference is now made to FIG. 3B, showing a SEM image of the resonator 2 on the substrate after the application of an isotropic etch. In this particular example, the interface area 21 after the isotropic etch has been reduced by approximately 90% compared to the interface area 21 after step a.

Figure 4A:
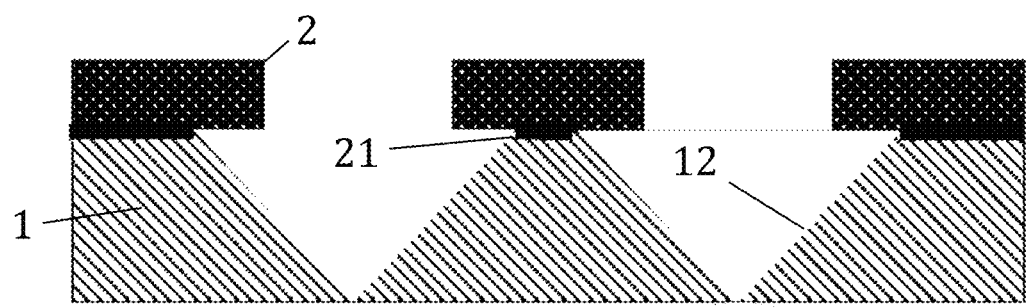
FIG. 4A is a schematic vertical cross-section and FIG. 4B is a SEM image of an example resonator on top of a substrate after application of an anisotropic etch.
Figure 4B:
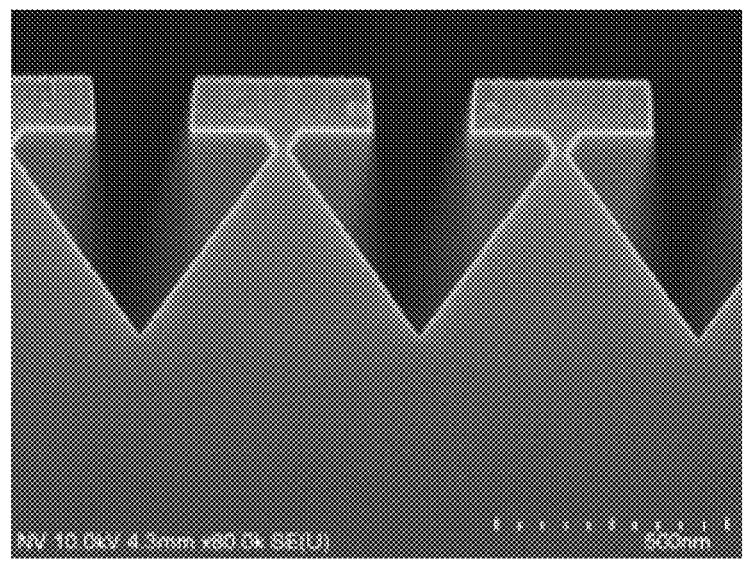

Reference is now made to FIG. 4A. Instead of the isotropic dry etch of FIG. 3A and FIG. 3B, instead, a liquid alkaline etching solution (for example, according to some embodiments of step a') is applied to the resonator 2 and substrate 1 obtained after step a. The liquid alkaline etching solution results in a highly anisotropic profile 12 of the substrate 1, e.g., substantially flat along a crystalline plane of the substrate 1. In this example, the liquid alkaline etching solution has reduced the interface area 21 by approximately two-thirds, e.g., 66%, compared to the interface area after step a. Reference is now made to FIG. 4B, which shows a SEM image of the resonator 2 on top of the substrate 1 after step a'.

Figure 5A:
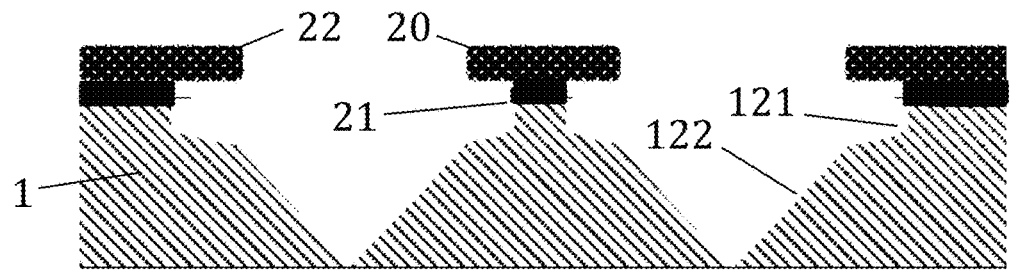
FIG. 5A is a schematic vertical cross-section and FIG. 5B is a SEM image of an example resonator on top of a substrate after application of an anisotropic etch, followed by an isotropic etch, according to embodiments of the disclosed technology.
Figure 5B:
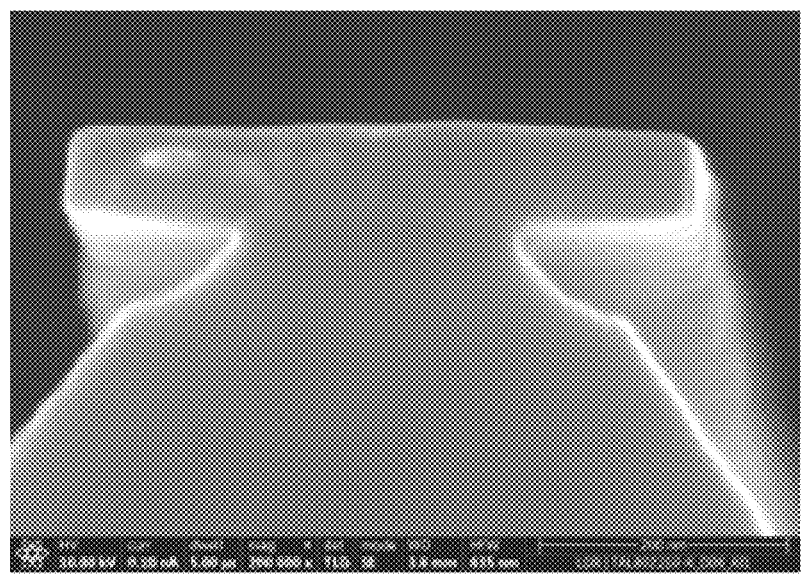

Reference is now made to FIG. 5A. After step a', e.g., on the resonator on top of the substrate shown in FIG. 4A, a liquid acidic etching solution (for example, according to some embodiments of step b of the method of the disclosed technology) is applied. This can further reduce the interface area 21, e.g., to approximately 30% of the surface area after step a, e.g., corresponding to a reduction of the interface area 21 by 70% compared to the interface area 21 after step a. The profile of the substrate 1 is a combination of an isotropic profile 121 and an anisotropic profile 122. The liquid acidic etching solution has a nonzero etch rate towards the resonator 2, so that the resonator now has rounded edges 20, for example the edges 20 have a radius of curvature that is considerably larger than the radius of curvature of the resonator after step a. Also, any oxides on the surface of the resonator and on the surface of the substrate 1, possibly formed on the application of step b, have been removed, e.g., with a HF etch, according to embodiments of step c of the method of the disclosed technology. FIG. 5A hence shows an embodiment of a resonator 22 according to some embodiments of the disclosed technology. FIG. 5B is an SEM image of a resonator 22 on top of the substrate 1 according to embodiments of the disclosed technology, and formed according to embodiments of the method of the disclosed technology.

It is to be understood that although embodiments, specific constructions, and configurations, as well as materials, have been discussed herein for devices according to the disclosed technology, various changes or modifications in form and detail may be made without departing from the scope of the disclosed technology. For example, any formulas given above are merely representative of procedures that may be used. Functionality may be added or deleted from the block diagrams and operations may be interchanged among functional blocks. Steps may be added or deleted to methods described within the scope of the disclosed technology.

What is claimed is:

1. A method of forming a modified resonator, the method comprising:
    obtaining a resonator on top of a substrate, the resonator comprising niobium or tantalum, thereby forming an interface area between a bottom surface of the resonator and a top surface of the substrate; and
    contacting the resonator and the substrate with a liquid acidic etching solution selected so as to have a higher etch rate towards the substrate than towards the resonator and a nonzero etch rate towards the resonator, wherein contacting the resonator and the substrate with the liquid acidic etching solution reduces the interface area by 5% to 95% with respect to the interface area formed by obtaining the resonator on top of the substrate.

2. The method according to claim 1, wherein the liquid acidic etching solution comprises HF and $HNO_3$.

3. The method according to claim 1, further comprising removing oxides on the surface of the resonator after contacting the resonator and the substrate with the liquid acidic etching solution.

4. The method according to claim 1, wherein the resonator consists of niobium.

5. The method according to claim 1, wherein the substrate comprises silicon, silicon germanium, or gallium arsenide.

6. The method according to claim 1, wherein contacting the resonator and the substrate with the liquid acidic etching solution reduces the interface area by 50% to 95% with respect to the interface area formed by obtaining the resonator on top of the substrate.

7. The method according to claim 1, further comprising, before contacting the resonator and the substrate with the liquid acidic etching solution, etching the substrate, selectively with respect to the resonator, by performing a dry isotropic etch, thereby reducing the interface area, and wherein contacting the resonator and the substrate with the liquid acidic etching solution further reduces the interface area.

8. The method according to claim 7, wherein the dry isotropic etch reduces the interface area by 5% to 95% with respect to the interface area formed in obtaining the resonator on top of the substrate.

9. A method of forming a modified resonator, the method comprising:
obtaining a resonator on top of a substrate, the resonator comprising niobium or tantalum, thereby forming an interface area between a bottom surface of the resonator and a top surface of the substrate; and
contacting the resonator and the substrate with a liquid acidic etching solution selected so as to have a higher etch rate towards the substrate than towards the resonator and a nonzero etch rate towards the resonator, wherein the resonator has at least one edge and wherein the at least one edge is rounded by contacting the resonator and the substrate with the liquid acidic etching solution.

10. The method according to claim 9, wherein, after contacting the resonator and the substrate with the liquid acidic etching solution, the rounded edge of the modified resonator has an average radius of curvature of 1.5 times to 3 times the average radius of curvature of the at least one edge before contacting the resonator and the substrate with the liquid acidic etching solution.

11. The method according to claim 9, wherein the rounded edge of the modified resonator has an average radius of curvature from 15 nm to 40 nm.

12. A method of forming a modified resonator, the method comprising:
obtaining a resonator on top of a substrate, the resonator comprising niobium or tantalum, thereby forming an interface area between a bottom surface of the resonator and a top surface of the substrate;
etching the substrate, selectively with respect to the resonator, by contacting the resonator and the substrate with a liquid alkaline etching solution, thereby reducing the interface area; and
contacting the resonator and the substrate with a liquid acidic etching solution selected so as to have a higher etch rate towards the substrate than towards the resonator and a nonzero etch rate towards the resonator, wherein contacting the resonator and the substrate with the liquid acidic etching solution further reduces the interface area.

13. The method according to claim 12, wherein the liquid acidic etching solution comprises HF and $HNO_3$.

14. The method according to claim 12, further comprising removing oxides on the surface of the resonator after contacting the resonator and the substrate with the liquid acidic etching solution.

15. The method according to claim 12, wherein the resonator consists of niobium.

16. The method according to claim 12, wherein the substrate comprises silicon, silicon germanium, or gallium arsenide.

17. A resonator on a substrate, the resonator comprising niobium or tantalum and at least one rounded edge having a radius of curvature from 15 nm to 40 nm, wherein a bottom surface of the resonator has an area larger than an interface area between the bottom of the resonator and a top surface of the substrate.

18. The resonator according to claim 17, wherein the radius of curvature averaged over all edges of the resonator is from 15 nm to 40 nm.

19. The resonator according to claim 17, wherein the interface area is from 5% to 95% of the area of the bottom surface of the resonator.

20. The resonator according to claim 19, wherein the interface area is from 50% to 95% of the area of the bottom surface of the resonator.

21. The resonator according to claim 17, wherein the substrate comprises silicon, silicon germanium, or gallium arsenide.

22. The resonator according to claim 17, wherein the resonator consists of niobium, and wherein the substrate comprises silicon, silicon germanium, or gallium arsenide.

23. A method of forming a modified resonator, the method comprising:
obtaining a resonator on top of a substrate, the resonator comprising niobium or tantalum, thereby forming an interface area between a bottom surface of the resonator and a top surface of the substrate;
etching the substrate, selectively with respect to the resonator, by performing a dry isotropic etch, thereby reducing the interface area by 5% to 95% with respect to the interface area formed in obtaining the resonator on top of the substrate; and
contacting the resonator and the substrate with a liquid acidic etching solution selected so as to have a higher etch rate towards the substrate than towards the resonator and a nonzero etch rate towards the resonator, wherein contacting the resonator and the substrate with the liquid acidic etching solution further reduces the interface area.

24. The method according to claim 23, wherein the liquid acidic etching solution comprises HF and $HNO_3$.

25. The method according to claim 23, further comprising removing oxides on the surface of the resonator after contacting the resonator and the substrate with the liquid acidic etching solution.

26. The method according to claim 23, wherein the resonator consists of niobium.

27. The method according to claim 23, wherein the substrate comprises silicon, silicon germanium, or gallium arsenide.

\* \* \* \* \*